US006934341B2

(12) United States Patent
Sahlman

(10) Patent No.: US 6,934,341 B2
(45) Date of Patent: Aug. 23, 2005

(54) METHOD AND APPARATUS FOR PLURALITY SIGNAL GENERATION

(75) Inventor: Karl-Gösta Emanuel Sahlman, Sollentuna (SE)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 865 days.

(21) Appl. No.: 09/941,364

(22) Filed: Aug. 28, 2001

(65) Prior Publication Data

US 2002/0048326 A1 Apr. 25, 2002

Related U.S. Application Data

(60) Provisional application No. 60/228,710, filed on Aug. 29, 2000.

(51) Int. Cl.[7] ........................ H04K 1/02; H04L 25/03; H04L 25/49
(52) U.S. Cl. .................. 375/297; 375/296; 455/114.1; 455/114.3; 330/151
(58) Field of Search ................................ 375/297, 296; 455/114.1, 114.2, 114.3; 330/149, 151, 136

(56) References Cited

U.S. PATENT DOCUMENTS

| 1,686,792 A | 9/1928 | Black |
| 4,291,277 A | 9/1981 | Davis et al. |

(Continued)

FOREIGN PATENT DOCUMENTS

| WO | 94/17587 A1 | 8/1994 |
| WO | 99 22444 A1 | 5/1999 |
| WO | 99/23756 A1 | 5/1999 |
| WO | 99/45638 A1 | 9/1999 |
| WO | 99/45640 A1 | 9/1999 |
| WO | 01 08293 A1 | 2/2001 |
| WO | 01 67592 A2 | 9/2001 |

OTHER PUBLICATIONS

Carver, James "Amplifier Linearization Using Digital Pre-distorter with Fast Adaption and Low Memory Requirements", *IEEE Trans. on Vehicular Technology* vol. 39, No. 4 (Nov. 1990).

Wright, Andrew S. and Durtler, Willem, "Experimental Performance of an Adaptive Digital Linearized Power Amplifier", *IEEE Trans. on Vehicular Technology* vol. 41, No. 4 (Nov. 1992).

*Primary Examiner*—Phuong Phu

(57) ABSTRACT

A solution for transmitting a plurality of carriers in a wireless system, such as GSM, TDMA, and WCDMA includes dividing a base-band digital input signal into two paths. In a reference path, an RF up-converter acts as a reference source for an analog FF error canceling loop having an RF bandwidth much wider than the required output (multiple carrier) bandwidth. The analog FF error loop also has an error-signal bandwidth that is wider than the error-signal bandwidth available from current ADC- and DAC-techniques. The other path feeds the base-band digital signal through another RF up-converter to an MPA in a FF MCPA and uses a digital predistortion technique to reduce distortion in the MPA, thereby easing the suppression demands on the analog FF error canceling loop in the MCPA. The difference (error) signal between the desired signal from the reference path and the actual MPA output signal is processed in an analog RF FF loop for canceling unwanted signals at the MCPA output.

22 Claims, 14 Drawing Sheets

U.S. PATENT DOCUMENTS

| | | | |
|---|---|---|---|
| 4,580,105 A | | 4/1986 | Myer |
| 5,049,832 A | | 9/1991 | Cavers |
| 5,732,333 A | | 3/1998 | Cox et al. |
| 5,760,646 A | * | 6/1998 | Belcher et al. ............. 330/149 |
| 5,862,459 A | | 1/1999 | Charas |
| 5,867,065 A | | 2/1999 | Leyendecker |
| 5,877,653 A | * | 3/1999 | Kim et al. .................. 330/149 |
| 5,892,397 A | | 4/1999 | Belcher et al. |
| 5,898,338 A | | 4/1999 | Proctor et al. |
| 5,923,712 A | | 7/1999 | Leyendecker et al. |
| 5,949,283 A | * | 9/1999 | Proctor et al. ............. 330/149 |
| 5,959,500 A | | 9/1999 | Garrido |
| 6,011,434 A | * | 1/2000 | Sakai ......................... 330/151 |
| 6,029,285 A | | 2/2000 | Belcher et al. |
| 6,061,568 A | | 5/2000 | Dent |
| 6,075,411 A | | 6/2000 | Briffa et al. |
| 6,078,216 A | * | 6/2000 | Proctor, Jr. ................. 330/151 |
| 6,163,213 A | | 12/2000 | Vaktnäs |
| 6,266,517 B1 | * | 7/2001 | Fitzpatrick et al. ....... 455/114.3 |
| 6,271,724 B1 | * | 8/2001 | Neffling ..................... 330/149 |
| 6,275,106 B1 | * | 8/2001 | Gomez ....................... 330/151 |
| 6,359,508 B1 | * | 3/2002 | Mucenieks ................. 330/149 |
| 6,363,120 B1 | * | 3/2002 | Myer et al. ................. 375/254 |
| 6,437,644 B1 | * | 8/2002 | Kenington .................. 330/149 |
| 6,583,739 B1 | * | 6/2003 | Kenington .................. 341/118 |
| 6,711,217 B1 | * | 3/2004 | Jeong ......................... 375/297 |

* cited by examiner

302

303

A:)

B:)

METHOD AND APPARATUS FOR PLURALITY SIGNAL GENERATION

This application claims priority under 35 U.S.C. §119(e) to application Ser. No. 60/228,710 filed in United States on Aug. 29, 2000; the entire content of which is hereby incorporated by reference.

BACKGROUND

This application relates to radio communication systems and in particular to power amplifier linearization and up-conversion of digital signals to radio-frequency signals.

Mobile radio communication systems like those used for cellular telephone communication divide the radio-frequency (RF) portion of the electromagnetic spectrum into a multiplicity of individual signaling channels or frequency bands. Particular channels are allocated to particular users as they access the system. Each user's communication path is routed through the system through the channel allocated to that user. Signals transmitted in the system must be carefully regulated so that they remain within the channels allocated to the various users. "Out of band" signals can spill over from one channel to another, causing unacceptable interference with communications in the other channels.

In order to increase the data transfer rate supported by such RF channels, linear modulations of an RF carrier signal's amplitude like quadrature amplitude modulation (QAM), m-ary phase shift keying (PSK), etc. are utilized rather than the modulations typical of older communication systems, like constant-amplitude phase or frequency modulation (PM or FM). These new linear modulations require communication systems to use high-linearity power amplifiers and up-converters (modulators) to avoid causing interference in other channels in the system. These linearity requirements are especially difficult to meet when a single power amplifier is used to amplify more than one RF carrier signal. Such an amplifier is usually called a multi-carrier power amplifier (MCPA).

Conventional RF-power-amplifier linearization includes a feed-forward (FF) technique and variants that aim to improve the performance of the basic technique. The basic idea of feed-forward compensation of amplifier distortion was described by H. S. Black in 1928 in U.S. Pat. No. 1,686,792, and is depicted in FIG. 1. An input signal 101, shown in the frequency domain as two impulses (carriers), is divided into two parts by a splitter 102. One part of the input signal is provided to a main power amplifier (MPA) 103 that produces a distorted output signal 104, shown in the frequency domain as a plurality of impulses. A sample of the output signal 104 is derived from a signal sampling device, depicted in FIG. 1 as a coupler 105, and this sample is compared by a comparator 106 with the other part of the input signal that has passed through a delay element 107 and been delayed in time by an amount $t_1$, that is equal to the temporal delay imposed by the MPA 103. The levels of the signals provided to the comparator 106 are adjusted such that the original input signal is cancelled out, leaving only the inverse of the distortion components from the MPA 103 as the difference signal produced by the comparator 105. This difference signal, referred to as an error signal hereinafter since it represents the error introduced by the MPA 103, is amplified by an error power amplifier (EPA) 108. The amplified error signal 109, shown in the frequency domain as a plurality of impulses, is combined by a coupler 110 with the rest of the output signal 104 that has passed through the coupler 105 and a delay element 111 and been delayed in time by an amount $t_2$ that is equal to the temporal delay imposed by the EPA 108. The coupler 110 combines the signals from the two amplifier chains in such a way that the distortion is canceled, leaving only an amplified input signal as a combined output signal 112, shown in the frequency domain as a pair of carriers (impulses). The amount of performance improvement depends critically on accurate adjustments of the delay elements 107, 111, with respect to the MPA and EPA delays and of the signal levels provided to the comparator 106 and coupler 110.

The variants of the basic FF technique typically predistort the signal provided to the MPA to reduce the distortion imposed by the MPA before applying the correcting signals in the FF loop, thereby improving efficiency and reducing corrections needed in the FF loop. Examples of the FF technique and variants are described in U.S. Pat. No. 5,892,397 to Belcher et al. for "Adaptive Compensation of RF Amplifier Distortion by Injecting Predistortion Signal Derived from Respectively Different Functions of Input Signal Amplifier" and International Patent Publications WO 9923756 for "Cartesian Control Device for Telecommunication Systems" by Briffa et al.; WO 9945640 for "Feedback Controller Predistorter for Linearizing High Power Radio Frequency Amplifiers" by Kennington; and WO 9945638 for "Predistorter Circuit for High Power Radio Frequency Amplifiers" by Kennington. These documents show a general increase of complexity in the analog circuitry used in generating the predistortion signals for the MPA or use of only predistortion linearization without a FF loop for less demanding applications.

With semiconductor technology improving in both digital signal processor (DSP) realizations and analog-to-digital converter/digital-to-analog converter (ADC/DAC) realizations, efforts have been made to do the predistortion in the digital domain. Some efforts involved digital predistortion in linear modulation, single-carrier power amplifiers that are described in U.S. Pat. No. 4,291,277 to Davis et al. for "Adaptive Predistortion Technique for Linearizing a Power Amplifier for Digital Data Systems" and U.S. Pat. No. 5,049,832 to Cavers for "Amplifier Linearization by Adaptive Predistortion", among others. Technical articles like James Carver, "Amplifier Linearization Using Digital Predistorter with Fast Adaption and Low Memory Requirements", *IEEE Trans. on Vehicular Technology* vol. 39, no. 4 (November 1990) and Andrew S. Wright and Willem Durtler, "Experimental Performance of an Adaptive Digital Linearized Power Amplifier", *IEEE Trans. on Vehicular Technology* vol. 41, no. 4 (November 1992) give insight into the evolution of digital predistortion techniques.

For the "multiple carrier" case, different approaches to digital predistortion and post-distortion are described in U.S. Pat. No. 5,732,333 to Cox et al. for "Linear Transmitter Using Predistortion"; U.S. Pat. No. 5,867,065 to Leyendecker for "Frequency Selective Predistortion in a Linear Transmitter"; U.S. Pat. Nos. 5,898,338 and 5,949,284 to Proctor et al. for "Adaptive Digital Predistortion Linearization and Feed-Forward Correction of RF Power Amplifier"; and U.S. Pat. No. 5,923,712 to Leyendecker et al. for "Method and Apparatus for Linear Transmission by Direct Inverse Modeling".

FIG. 2 depicts the basic ideas disclosed in the patents to Proctor et al. and Leyendecker et al. One difference from Black's basic idea in FIG. 1 that will be seen is that the comparison implemented by the comparator 106 is done in the digital domain. In FIG. 2, a digital baseband (BB) signal generator 201 generates an input signal that is provided to a digital predistorter 202 and a digital FF correction module 203. An RF down-converter 204 receives a sample of the output signal produced by an MPA 205 produced by a coupler 206. An output signal produced by the down-converter 204 is provided to the correction module 203 that communicates with a digital correction estimator 207 that calculates tables to be used by the predistorter 202 for modifying the signal provided to the MPA 205 through a DAC and RF up-converter 208. The distortion imposed by the MPA 205 is thereby reduced. The remaining errors in the signal produced by the MPA 205 are compared in the digital domain in the digital FF correction module 203 that produces an error signal that is fed to a second DAC and up-converter 209 that drives an EPA 210. The EPA 210 cancels the remaining distortion at the output of the MPA by combining the error signal with the MPA's output signal in anti-phase through a coupler 211. Timing and gain adjustments are handled in the digital processing carried out by the correction estimator 207 and are used to update the real-time processing circuits 202, 203. The cited patents differ mainly in their implementations of the digital parts in devices 202, 203, 207.

An advantage of the implementation depicted in FIG. 2 is that all delay compensation in Black's original idea is performed in the digital domain. A disadvantage of this implementation is that the correction signal bandwidth is limited by the bandwidth of the digital correction circuits. The bandwidths of the DACs used in the up-converters 208, 209 and of the ADC in the down-converter 204 must be equal, and to correct third-, fifth-, or seventh-order distortion components, the bandwidths of the DACs and ADC must be at least three-, five-, or seven-times the bandwidth of the input signal. The bandwidths of currently available DACs and ADCs limit the bandwidth of the correction, making this implementation useful only in narrow-bandwidth applications.

The cited patents and publications rely on the fact that amplifier distortion can not be described only by measurements of two-tone intermodulation (IM) performance (e.g., third-, fifth-, or seventh-order IM performances) as described in the literature. The model for the amplifier must incorporate more data dimensions, taking account of so-called "memory effects". By integrating the input signal over a predetermined time period, an estimate of the input signal's peak-to-average signal level is made. These estimates are used to create lookup tables of values that describe the device's performance dependence on factors other than the actual input signal strength. The well known two-tone IM measurement describes device performance only for a 3-dB peak-to-average swing of an input signal. If the input signal is a plurality of signals (e.g., a plurality of carriers), the peak-to-average values vary with time, yielding varying device performance.

U.S. Pat. No. 5,898,338 cited above describes one way to get peak-to-average signal estimates with a so-called "leaky integrator" and from those to create two-dimensional tables describing the performance of the amplifier. This patent and U.S. Pat. No. 5,949,283 and U.S. Pat. No. 5,959,500 to Garrido for "Model-Based Adaptive Feedforward Amplifier Linearizer" are different implementations of how to create look-up tables from observations of an amplifier's output signal and use the tables to pre-distort the amplifier's input signal to reduce the distortion of the output signal. These patents also deal with using the created look-up tables to create post-distortion signals that are subtracted from the main amplifier's output signal by another amplifier. U.S. Pat. No. 5,923,712 describes a method of reducing the size of these tables by using tables containing extracted finite-impulse response (FIR) filter coefficients.

SUMMARY

In accordance with one aspect of Applicant's invention, improved digital predistortion techniques are used in a very high performance, a multiple carrier, RF signal generator having digital baseband input signals. The invention also provides special functions required in a digital processor and digital real-time circuit for adjusting RF up-converters and RF down-converters that are in addition to the conventional functions required for RF-amplifier digital predistortion. Drawbacks of previous techniques like those described in U.S. Pat. Nos. 5,898,338 and 5,959,500, which are essentially RF narrow-band solutions that rely on the control and measurement bandwidths of the DACS and AACS used, are avoided.

In accordance with another aspect of Applicant's invention, an up-converter that converts input baseband digital signals to output RF signals is described. Applicant's up-converter avoids the problems associated with very-narrow-band intermediate frequency (IF) bandpass filters that are currently realizable only in surface acoustic wave (SAW) devices having high insertion loss and resultant lower output signal-to-noise ratios (SNRs). Applicant's up-converter uses less frequency selective filters with lower pass-band ripple that can be realized in conventional inductor-capacitor (LC) devices.

In accordance with another aspect of Applicant's invention, a baseband digital input signal is divided into two paths. In a reference path, an RF up-converter acts as a reference source for an analog FF error canceling loop having an RF bandwidth according to the required output (multiple carrier) bandwidth. The analog FF error loop also has an error-signal bandwidth that is wider than the error-signal bandwidth available from current ADC- and DAC-techniques. The other path feeds the baseband digital signal through another RF up-converter to an MPA in a FF MCPA and uses a digital predistortion technique to reduce distortion in the MPA, thereby easing the suppression demands on the analog FF error canceling loop in the MCPA. The difference (error) signal between the desired signal from the reference path and the actual MPA output signal is processed in an analog RF FF loop for canceling unwanted signals at the MCPA output.

In accordance with another aspect of Applicant's invention, a down-converter that converts input RF signals to output baseband digital signals is described that can be used for updating in Applicant's adaptive digital predistortion technique. Applicant's down-converter can be used to perform RF measurements on different RF signals for developing control information for adjusting the overall precision and performance of Applicant's up-converter. The down-converter can be frequency-adjusted differently from the up-converter paths to ease the extraction of the needed predistortion and control information for the up-converter.

BRIEF DESCRIPTION OF THE DRAWINGS

The above and other objects, features, and advantages of the invention will become more apparent after reading this description in conjunction with the drawings, in which like reference numerals identify like elements, and in which.

DETAILED DESCRIPTION

Figure 3:
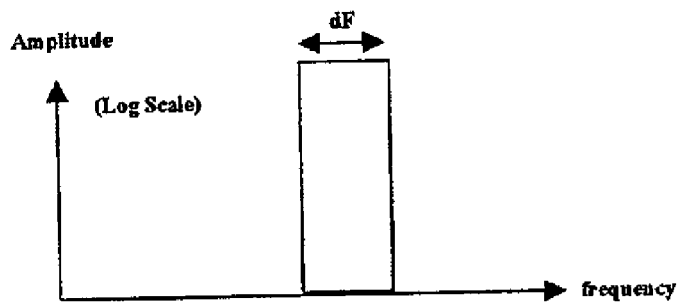
FIG. 3 illustrates the basic IM performance of an analog amplifier or non-linear device when a signal having a certain bandwidth is used as input and when a tripled input signal bandwidth is used for the predistortion.
Figure 3:
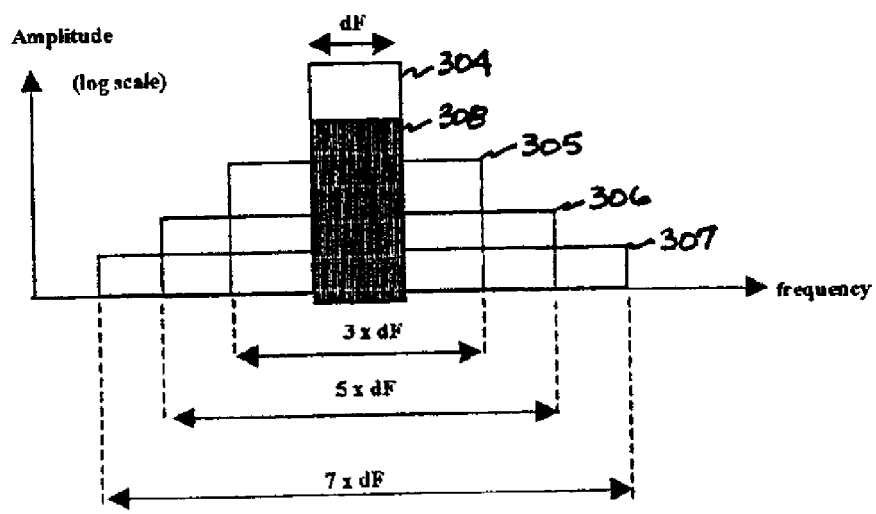
Figure 3:
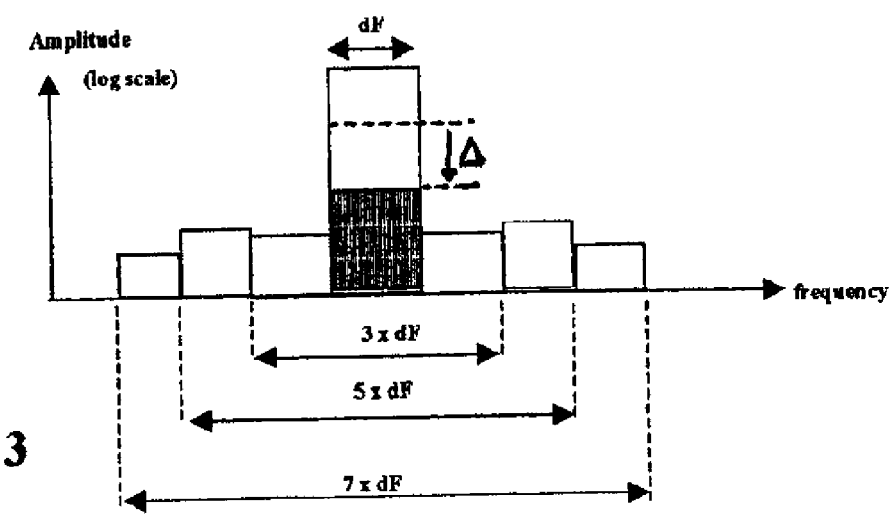

FIG. 3 illustrates the basic distortion behavior of a non-linear device, such as an amplifier, that is stimulated by a signal 301 having a finite frequency bandwidth dF.

The resulting output signal 302 after passing through the non-linear analog element is the sum of the input signal 304, third order distortion 305, fifth order distortion 306, seventh order distortion 307, other higher order distortions (not shown), and IM distortion 308 within the input signal bandwidth generated by the third, fifth, seventh, and higher order distortion. In general, distortion products decrease in amplitude and increase in bandwidth respectively as the order increases.

Also illustrated 303, is the basic performance achieved by applying a predistortion signal with a 3*dF bandwidth (predistortion signal bandwidth) to cancel the distortion components of the signal within the 3*dF bandwidth. The predistorter, which cannot distinguish between the different IM-signals within the 3*dF bandwidth, reduces the entire IM contribution, i.e., fifth, seventh, and higher order distortion, within the 3*dF bandwidth. The IM distortion within the input signal bandwidth dF is decreased by an amount Δ as a result of the distortion cancellation within the predistortion signal bandwidth. The signal bandwidth outside the predistortion signal bandwidth remains relatively unchanged, typically resulting in a spectrum level increase of only 3–5 dB. However, the IM levels in the predistorted signal are significantly reduced.

Figure 1:
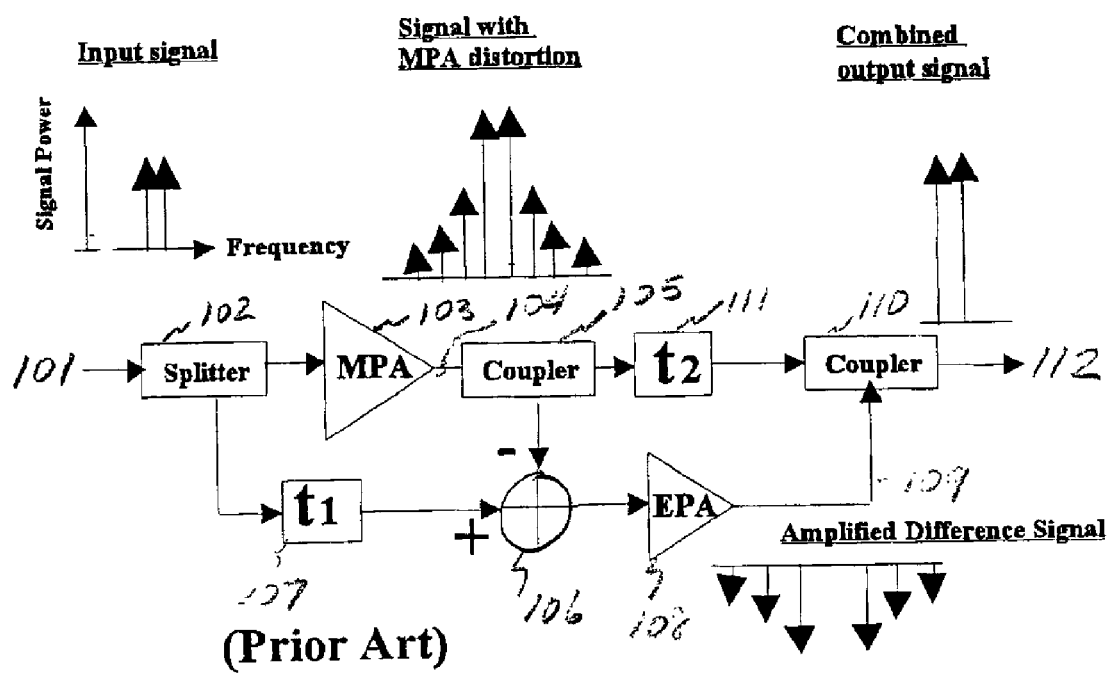
FIG. 1 is a block diagram illustrating a conventional FF system.
Figure 2:
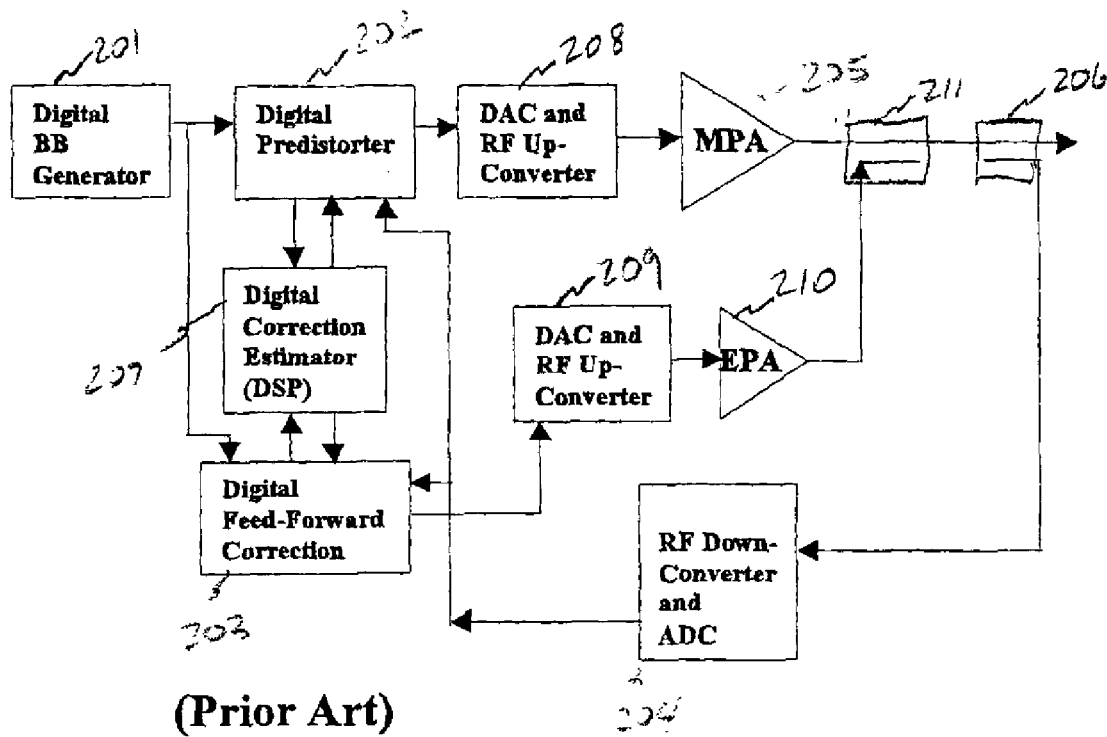
FIG. 2 is a block diagram illustrating a conventional combination of digital predistortion and FF techniques.
Figure 4:
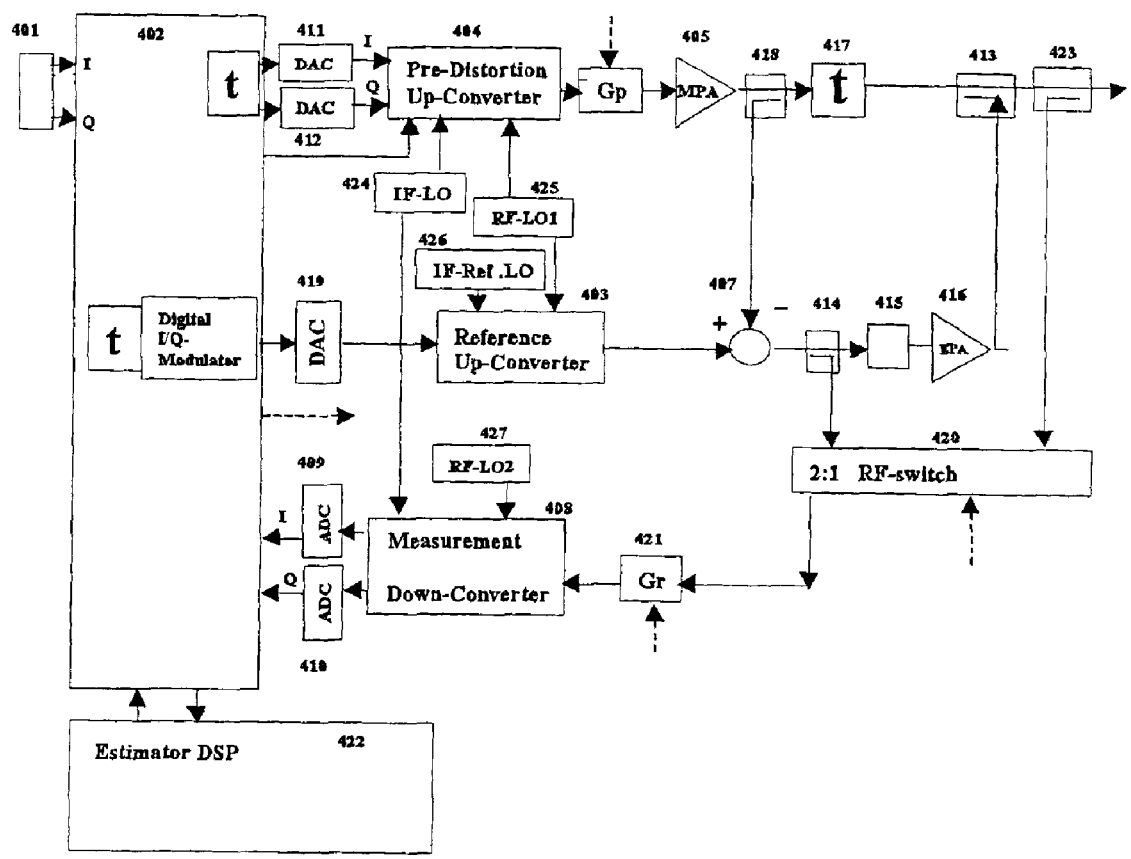
FIG. 4 is a block diagram illustrating distortion compensation in accordance with an embodiment of the present invention.

The block diagram of FIG. 4 illustrates digital predistortion in FF amplifiers having wider bandwidths than achievable with the prior art digital predistortion and postdistortion methods described above with reference to FIG. 2.

According to one aspect of the invention, digital predistortion techniques are used to reduce the signal levels of third order distortion down to the signal levels of higher-order distortion, e.g., fifth-order and higher. Predistortion signal bandwidths greater than or equal to three times the input signal bandwidth are used together with DAC and ADC techniques in an optimal way, while canceling the wider band distortion products with an analog feed forward loop. By optimally combining the best of these techniques, distortion canceling in an amplifier is improved.

The error amplifier 416 in the FF loop is required to provide less power to the output canceling combining point 413, thereby improving overall efficiency. Digital predistortion also improves overall resistance to amplifier failure, since any drift in the MPA characteristics, such as gain or IM distortion, versus frequency and/or amplitude can be compensated.

In FIG. 4, a signal generator 401 produces a digital input signal that may include in-phase (I) and quadrature-phase (Q) components. For illustrative purposes, aspects of Applicant's invention are shown and described below with reference to I/Q input signals, but Applicant's invention is not limited to I/Q input signals. The I/Q input signal is used by a digital real-time controller 402 to provide correct signal delays and gain adjustments for driving two RF up-converter chains. One chain, referred to as the reference chain, includes a precision reference up-converter 403, which translates the I/Q input signal to the desired RF portion of the spectrum. The other chain, referred to as the predistortion chain drives the input of an MPA 405 and includes a predistortion up-converter 404 that combines the I/Q input signal with a predistortion signal to reduce the overall distortion of the output signal produced by the MPA 405. A sampling device, shown as a coupler 418, provides a sample of the output of the MPA 405 to a signal comparator 407, which compares the sampled MPA output to an output signal of the reference up-converter 403 that is driven by a DAC 419.

The controller 402 provides the correct delay and gain compensation necessary to cancel the I/Q input signal from the output of the comparator 407 using digital adaptation processing. The output signal produced by the comparator 407 is an error signal resulting from the difference of the two inputs. The error signal is supplied to a wide-band FF loop that amplifies the error signal and combines the amplified error signal in anti-phase with the output of the MPA 405 to cancel the wide-band distortion.

In the error path of the wide-band FF loop, a sampling device, such as a coupler 414, samples the error signal from the comparator 407. The sampled distortion signal is provided to a measurement RF down-converter 408 through a RF switch 420 and a programmable wide-band signal attenuator 421. The attenuator 421 adjusts the measurement levels to achieve optimal resolution within the measurement down-converter's 408 dynamic range. The measurement chain, which includes the attenuator 421, measurement down-converter 408, and ADCs 409, 410, provides digital measured I/Q signals of the distortion to the controller 402.

The controller 402 is interfaced with an estimator digital signal processor (DSP) 422 that estimates the performance of the system by comparing the measured signal with a delayed copy of the input signal 401. After processing the delay and accessing predistortion look-up tables (LUT) stored in a memory accessed by the DSP 422, the controller 402 is adaptively updated.

The RF down-converter 408 also receives samples of the output signal from the feed-forward amplifier circuit via the output signal sampler 423, RF switch 420, and optimal amplitude adjuster 421. The RF down-converter 408 provides the DSP 422, via the ADCs 409, 410 and controller 402, with a measure of the optimal adjustment of the error loop, including fine tuned gain and phase adjustments of the error loop gain and phase adjuster 415. The gain and phase adjuster 415 corrects minimum gain and phase ripple errors between an EPA 416 and the delay element 417 to achieve optimum distortion cancellation in the signal combiner 413.

LOs 424 and 425 provide the necessary IF and RF carriers, respectively, to the predistortion up-converter 404. Similarly, LOs 426 and 425 provide the necessary IF and RF carriers, respectively, to the reference up-converter 403 and LOs 424 and 427 provide the necessary IF and RF carriers, respectively, to the measurement down-converter 408. Accurate low noise LOs 424–427 are required to avoid degrading system performance by introducing phase noise to the respective converters.

Figure 5:
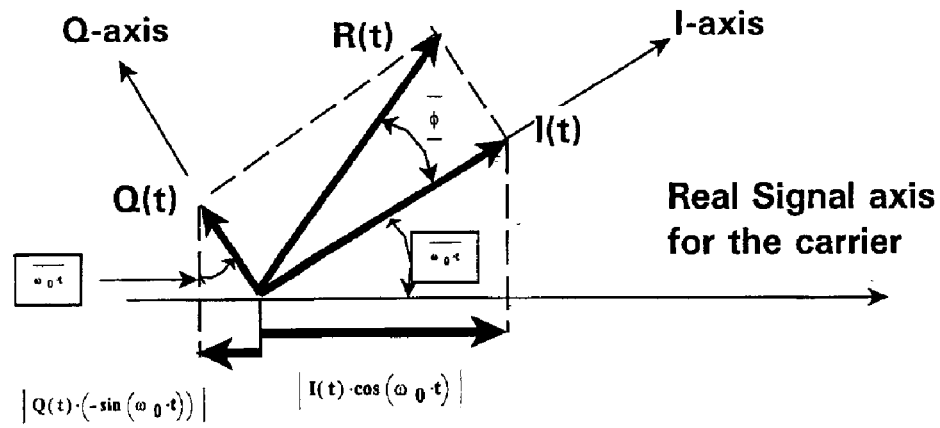
FIG. 5 illustrates a digital intermediate frequency (IF) signal apparatus using a digital I/Q modulator and one DAC.
Figure 5:
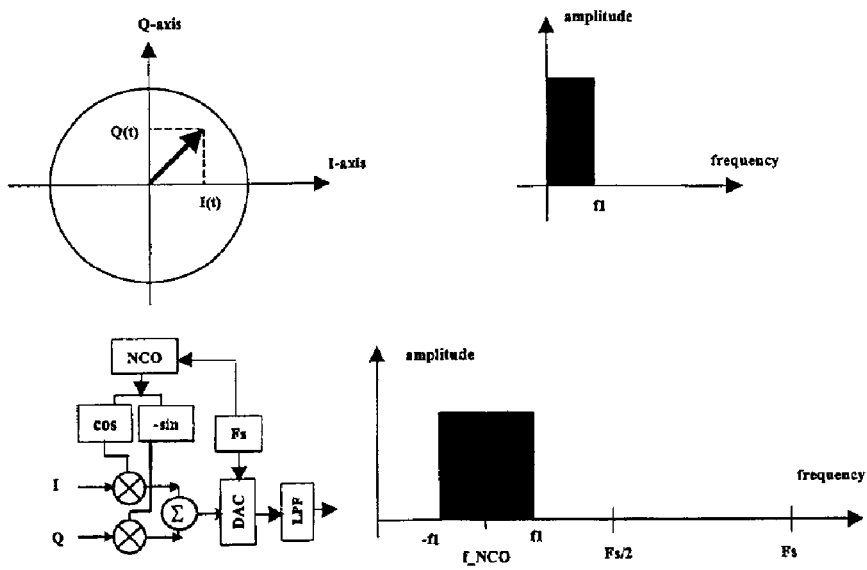

The analog FF loop provides wider bandwidth performance than prior art digital predistortion solutions suffering DAC bandwidth limitations. By using digital baseband signals, the RF down-converter's 408 bandwidth is increased dramatically as compared to using a digital-IF scenario, which is described below with reference to FIG. 5.

The accuracy of the adjustments is dependent on how the RF down-converter 408 is compensated for introduced internal errors, which is described below with reference to FIG. 6.

The predistortion up-converter 404 also uses error correction for the internal analog I/Q-modulators driven by DACs 411 and 412. The predistortion up-converter 404 has a wider bandwidth than the reference up-converter 403 in order to provide distortion signals covering more than the used input signal bandwidth.

An I/Q modulator performs up-conversion from the two baseband signals I and Q to an intermediate frequency at $\omega_O$. FIG. 5A shows the vector diagram for an I/Q-modulator. The real output signal, which is the signal that is output from the modulator, is shown mapped on to the real signal axis. The basic I- and Q-signal plane describing the desired output vector "R", described by its amplitude R(t) and f(t), is rotated by the phase of the local oscillator $\omega_O(t)$. The projection of the resulting signal onto the real signal axis is therefore the sum of vectors $Q(t)*(-\sin(\omega_O(t)))$ and $I(t)*\cos(\omega_O(t))$.

FIG. 5B is a block diagram illustrating the generation of a "Digital-IF" signal from a baseband orthogonal digital I- and Q-signals. The digital I/Q-signals are supplied to two digital multipliers and are multiplied by a "cos" and a "−sin" signal generated from the phase word 2*p*f_NCO*t provided by the Numerically Controlled Oscillator corresponding to the frequency f_NCO, which is used as the digital IF-frequency. The I-signal is multiplied by the cos value of the NCO phase and the Q-signal is multiplied by the -sin value of the NCO phase for each sample clock period. The phase of the NCO is increased by 2*p*f_NCO*Ts for each sample of the sample clock. Ts is equal to 1/Fs, where Fs is the sample clock frequency. The output from the multipliers are summed together and truncated to the number of digits that the DAC requires. The analog output signal from the DAC is band-pass or low-pass filtered so the response from the DAC is limited to the first Nyquist zone defined from 0 Hz to Fs/2 Hz.

Figure 6:
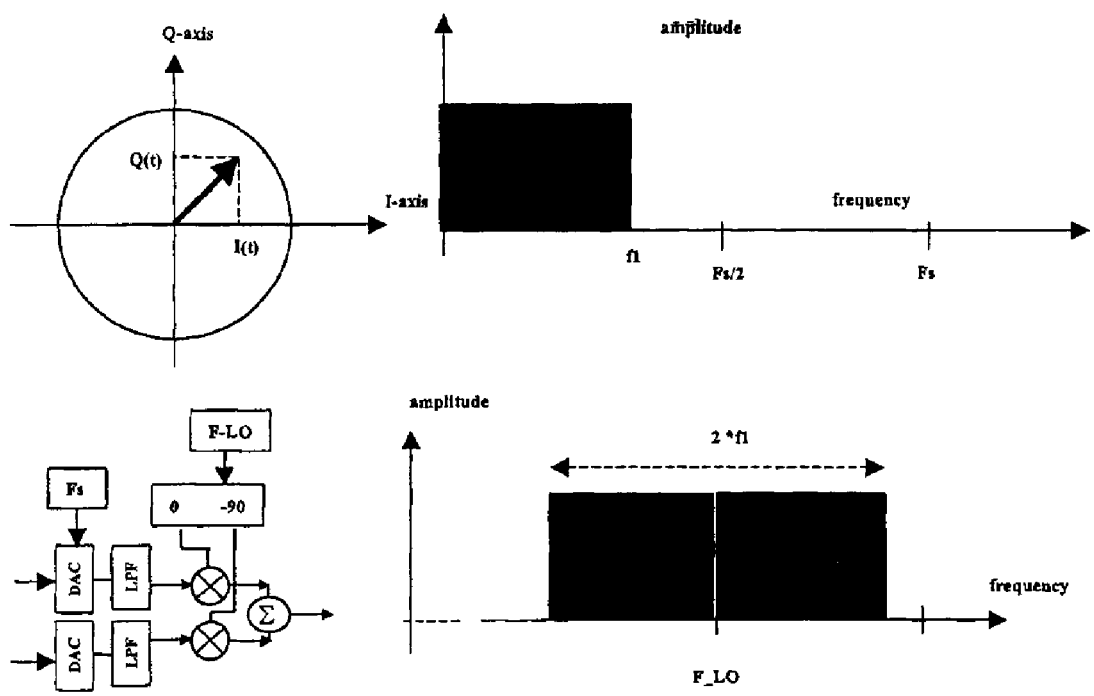
FIG. 6 illustrates a digital I/Q signal applied to an analog modulator circuit using two DACs.

FIG. 6 is a block diagram illustrating the I- and Q-signals being provided in an analog format by two DACs and supplied to an analog I/Q- modulator. In comparison to FIG. 5, and assuming that the highest available frequency for the DAC-technology is f1, the resulting bandwidth from an analog modulator with two DACs is far greater than from the digital-IF generator of FIG. 5 when using the same clock frequency. However, there is a tradeoff in that the accuracy is decreased due to inherent imperfections present in the analog modulator, which produce errors in the output signals due to orthogonal errors, gain imperfections between the I- and Q-signals, and DC-offsets in the I- and Q-signals. When utilizing a modulator in the digital domain, as in FIG. 5, performance is only limited by numerical precision. Thus, in order to take advantage of the wider bandwidth available in an analog modulator, the produced errors must be compensated for.

Figure 7A:
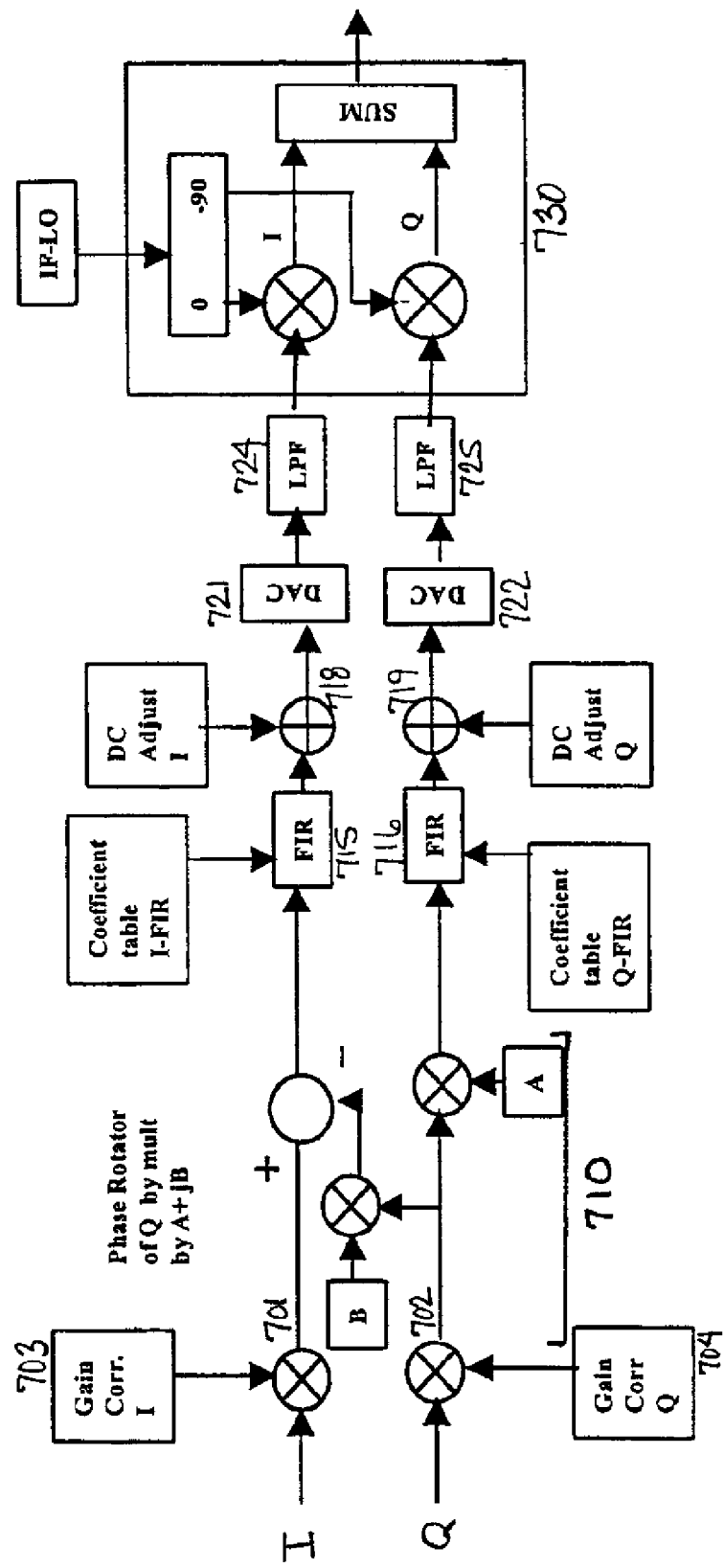
FIG. 7 illustrates a digital compensation technique for an analog I/Q up- and down-converter.
Figure 7:
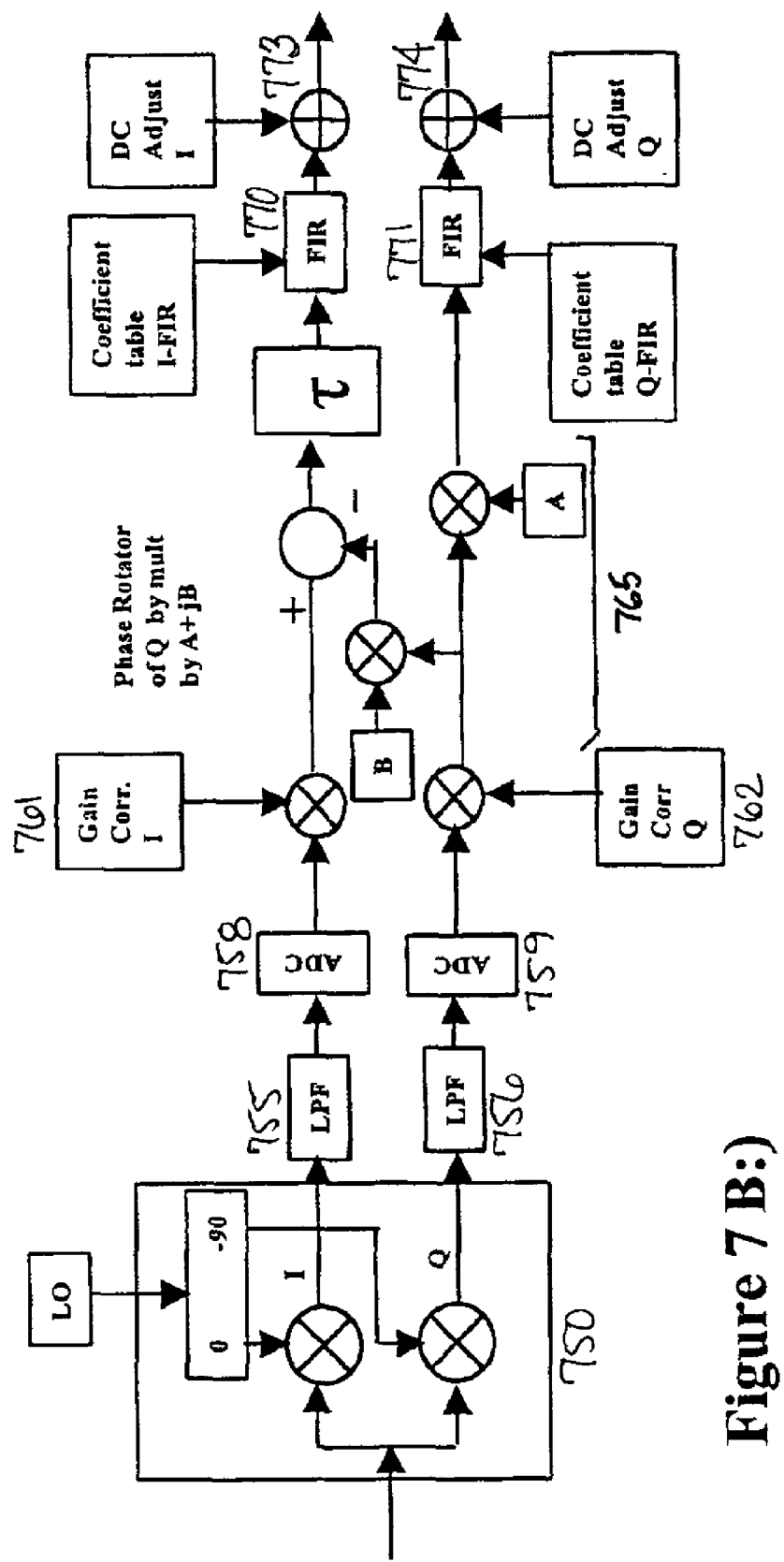

The block diagram of FIG. 7A illustrates the correction structure required for minimizing the analog modulator up-converter errors to acceptable levels. The I- and Q- digital baseband signals are each supplied to a digital multiplier 701, 702, where multiplication of gain correction factors 703, 704 minimizes the errors in the analog mixers. The orthogonal error in the analog I- and Q- signals emerging from the errors in the 0 and 90 degree splitter of the IF local oscillator is corrected by phase rotation 710 of the Q-signal. The phase rotation is performed by multiplying the Q-signal with a complex phase rotation vector A+jB having a magnitude equal to one according to the expression: jQ*(A+jB)=jQA−QB. The real signal QB is subtracted from the I-signal. The I-signal is not rotated and is used as a reference for the complex I+jQ signal phase. The rotation is done to align the signals before comparison in the comparator. The phase correction value in radians at the Q-vector is arctan(B/A). The modulator bandwidth is enhanced by digital FIR filters 715, 716, which correct for differences in the frequency response of the output and the analog modulator. IF-LO leakage is corrected by adjusting the DC- offsets to add or subtract a DC-correction value to each I- and Q-signal in respective summers 718, 719. The corrected I-and Q-signals are each supplied to a respective DAC 721, 722 and analog low-pass filter 724, 725 before being provided to the analog I/Q- modulator 730.

The correction structure of FIG. 7A requires a measurement device and an estimator DSP, such as the measurement down-converter 408 and estimator DSP 422 illustrated in FIG. 4, to provide the required correction values. The output signal from the analog modulator 730 must be converted back to digital I- and Q-signals, as illustrated below in FIG. 7B, and compared to the original I- and Q- base-band signals input to the correction structure.

Algorithms that utilize known signal processing techniques may be used to obtain the required correction values. The first step is to resolve the correct timing and phase between the signal from the reference chain and the signal received by the measurement down-converter 408. An approximation may then calculated for the I and Q gain correction and DC offset adjustment values and an optimization routine is then used to minimize the orthogonal errors between the known reference signal and the received signal.

The block diagram of FIG. 7B illustrates the correction of an analog demodulator circuit used in a receiver for down conversion of an IF- or RF-signal. The demodulator corrections can be resolved by measuring a signal provided by a digital IF-source having a precise numerically made modulator as described in FIG. 7A. The corrections are resolved by first comparing the original input signals with the received I-and Q-signals from the demodulator. Normal signal processing techniques are then used in a digital signal processor and the results are used to update the correction factors for the demodulator.

In FIG. 7B, an IF or RF signal is supplied to a demodulator 750. The resulting I-and Q-signals are each supplied to a respective ADC 758, 759 via low-pass filters 755, 756. The I- and Q- signals are multiplied by gain correction factors 761, 762 to minimize any introduced errors. The orthogonal error in the analog I- and Q- signals emerging from the errors in the 0 and 90 degree splitter of the IF local oscillator is corrected by phase rotation 765 of the Q-signal performed by multiplying Q-signal with a complex phase rotation vector A+jB having a magnitude equal to one. The rotation is done to align the signals before comparison in the comparator. The phase correction value in radians at the Q-vector is arctan(B/A). The modulator bandwidth is enhanced by digital FIR filters 770, 771, which correct for differences in the frequency response of the output and the demodulator. IF-LO leakage is corrected by adjusting the DC-offsets to add or subtract a correction value to each I- and Q-signal in respective summers 773, 774.

Figure 8:
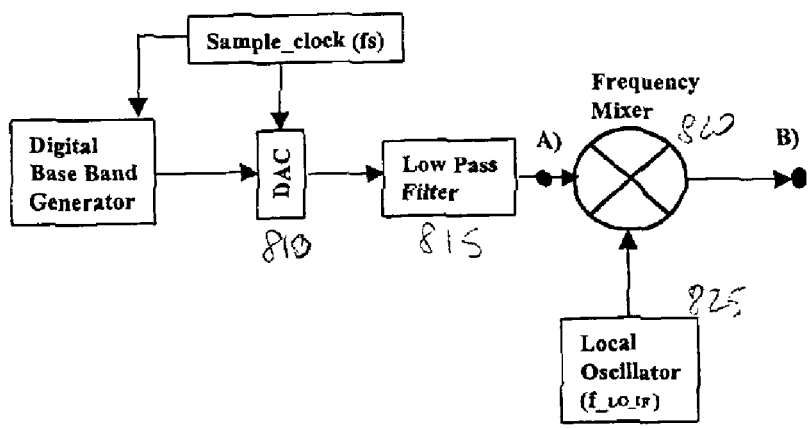
FIG. 8 illustrates a digital-IF baseband generator driving a DAC and an IF up-converter.
Figure 8:
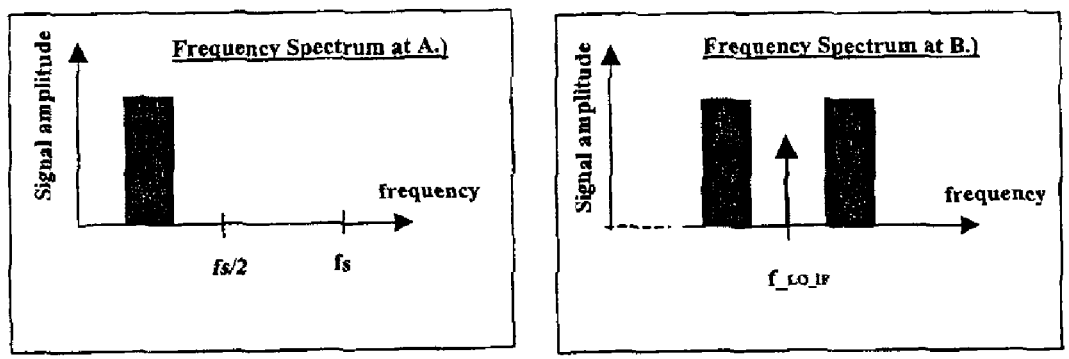

The block diagram of FIG. 8 illustrates an up-converter that converts the digital IF spectrum generated in the digital baseband fitting a DAC first Nyquist zone, where the DAC has the best signal dynamic performance. The digital IF signal is provided to a DAC 810 followed by a low-pass, or band-pass, filter 815 to provide an analog signal A. This signal is input to a frequency mixer 820 driven by a local oscillator 825 at $f_{LO\_IF}$ to provide an output signal B. The input digital IF spectrum at A and the output spectrum after the mixer at B are also shown FIG. 8. The output signal contains two spectrums. The spectrum situated higher than the IF-local oscillator frequency is the desired spectrum while the lower spectrum is called the image spectrum. The output spectrum will also contain a signal shown as an arrow at $f_{LO\_IF}$, which is the local oscillator leakage present in an analog frequency mixer. Normally this signal is 20–30 dB below the input IF local oscillator level in a practical analog mixer implementation.

Hereinafter, the desired spectrum will be referred to as the "upper side-band". However, a person having ordinary skill in the art will realize that the desired spectrum may be the "lower side-band" by simply interchanging the I- and Q-signals input to the modulator when providing a digital IF signal. The lower side-band and the IF local oscillator leakage are therefore, in this implementation, considered spurious signals and must be filtered away. The frequency difference between the desired spectrum and the IF local oscillator frequency and lower side-band is very low in a practical digital IF generator. Due to the limited sample rates available for data transfer to a DAC, very high skirt selectivity is required in a filter to effectively suppress the spurious signals.

Figure 9:
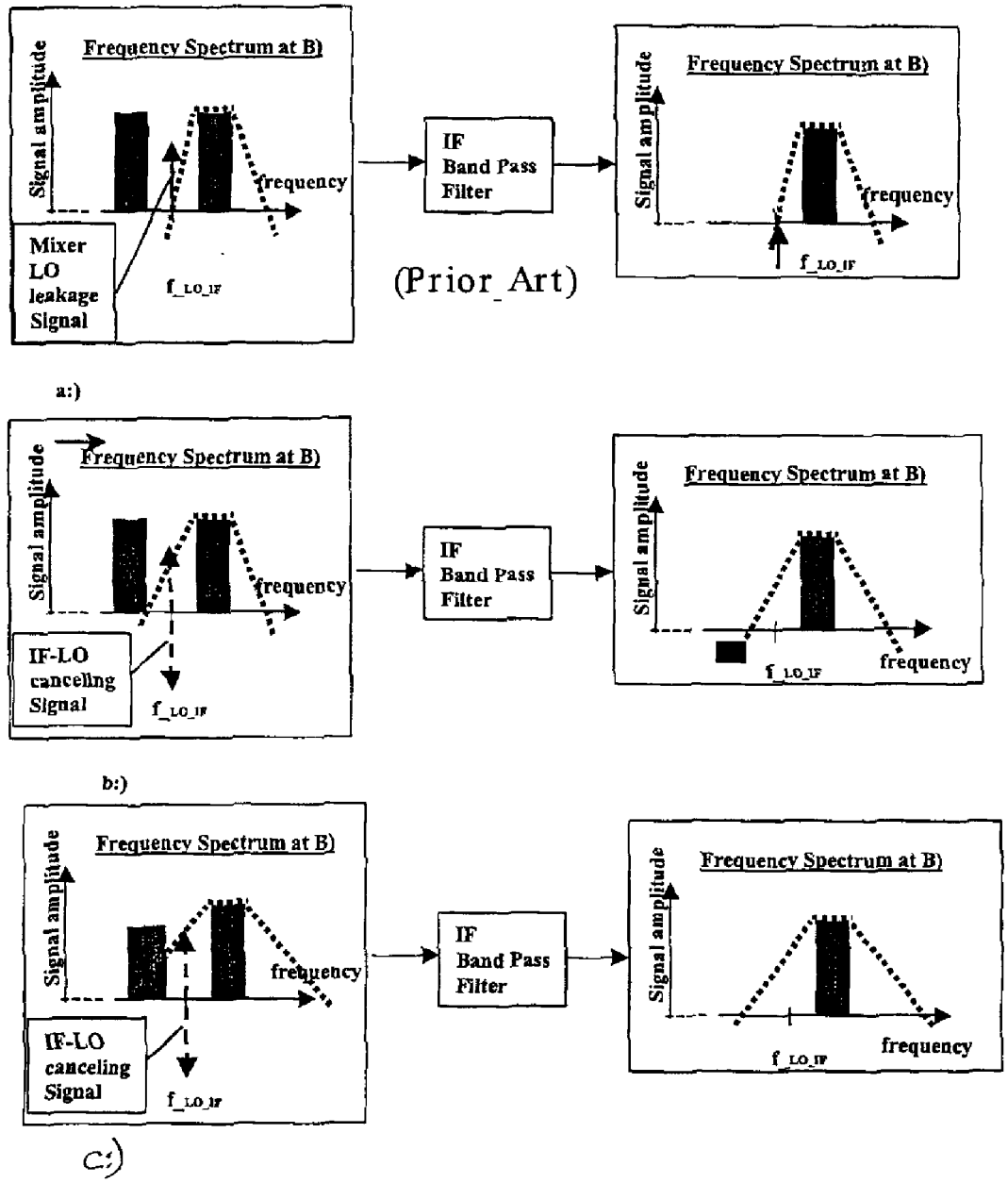
FIG. 9 illustrates the relaxation of filter skirt selectivity by using active IF local oscillator (LO) cancellation.

FIG. 9 illustrates the needed IF-filter skirt selectivity for different implementations of up-conversion of a digital IF-signal using frequency mixing techniques. The filter is preferably placed after the up-conversion mixer.

A prior art application is illustrated in FIG. 9a. The filter attenuation required to suppress the IF-LO leakage require the filter skirts to be very steep, which produces very high pass-band ripples at the filter. This type of filter specification normally requires filters with very high insertion loss. Normally one or two SAW-filters are used in such an application. Saw filters with that type of skirt selectivity also have varying pass band ripples that are hard to compensate for. The design of such an up-converter structure is typically problematic with respect to signal to noise specifications of the overall design, since high attenuation in the filters results in high noise figures. One way to avoid this problem is to filter at higher signal levels to reduce the influence of the noise figure of the filter. Another pitfall is that SAW filters have worse IM performances than normal LC-filters, which requires better IM-performance in the active components, such as amplifiers and mixers, since they work at higher signal levels. This means that higher bias and higher power dissipation is required in the design.

FIG. 9b illustrates schematically the results of applying active IF-LO canceling after the mixer and filter in accordance with an embodiment of the invention. The demand of IF-filter skirt attenuation is consequently loosened. The filter need only suppress the image side-bands of the up-conversion. This implementation provides the possibility to use normal wider bandwidth LC-filters with less insertion loss. The pass band ripples are also reduced. The pitfalls of prior art implementations are thus avoided.

FIG. 9c illustrates the filter application using an image reject mixer instead of a normal frequency mixer. Normally an image rejection of 20–30 dB is present with such a design. With the application of active LO-cancellation, the filter skirt attenuation demands can be further reduced by 20–30 dB by adding an extra mixer circuit and digital correction for the introduced image reject mixer inaccuracies similar to the correction needed for an analog modulator.

Although active LO-cancellation is described above as being implemented at IF-frequencies, it is also applicable to a final stage RF up-converter.

Figure 10:
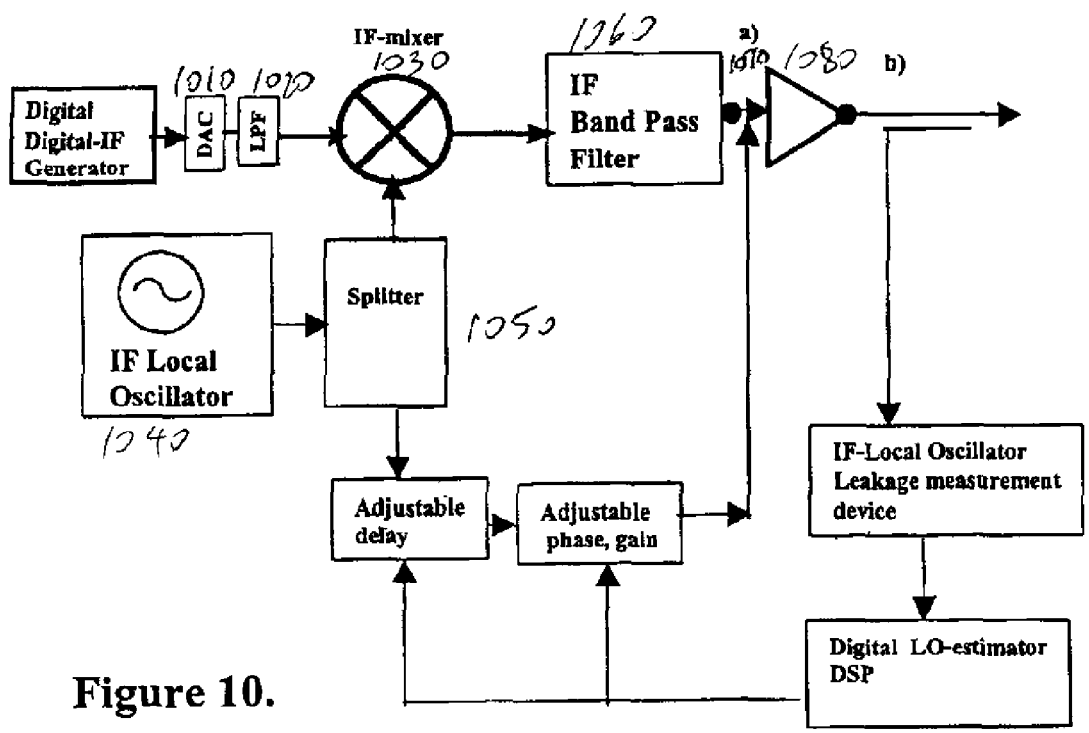
FIG. 10 illustrates an implementation of IF LO cancellation.

FIG. 10 is a block diagram illustrating one implementation of active LO-cancellation. The digital IF-baseband signals are converted to an analog signal via DAC 1010 and low pass filter 1020 are input to a linear multiplier (mixer) 1030 driven by an IF local oscillator 1040 through a splitter 1050. The output from the mixer is fed through an IF-filter 1060. The IF-filter 1060 output is added to a canceling IF LO-signal in a signal adder 1070 and supplied to an amplifier 1080. The output signal from the amplifier 1080 is sampled by a measuring receiver for measuring the LO-leakage. The signal after the signal sampler, such as a coupler, is provided to further stages in the multiple signal generator chain, such as the final RF up-conversion mixer. The IF LO-leakage measuring device provides digital output to a digital signal processor that calculates the amount of LO leakage and provides correction data to the adjust for delay, phase, and gain in order to cancel the LO-signal at the output of the amplifier. The adjustable delay, phase, and gain blocks are adaptively updated during operation of the circuit.

The delay element is only needed when very high levels of LO-leakage cancellation is needed. Normally the IF-local oscillator has very small phase and frequency errors, which means that the delay element can be omitted. Also, the amplifier shown in FIG. 10 may be another component fitting the overall up-converter design. The measurement of the LO-leakage can be made, for instance, by the measurement down-converter 408 of FIG. 4.

Figure 11:
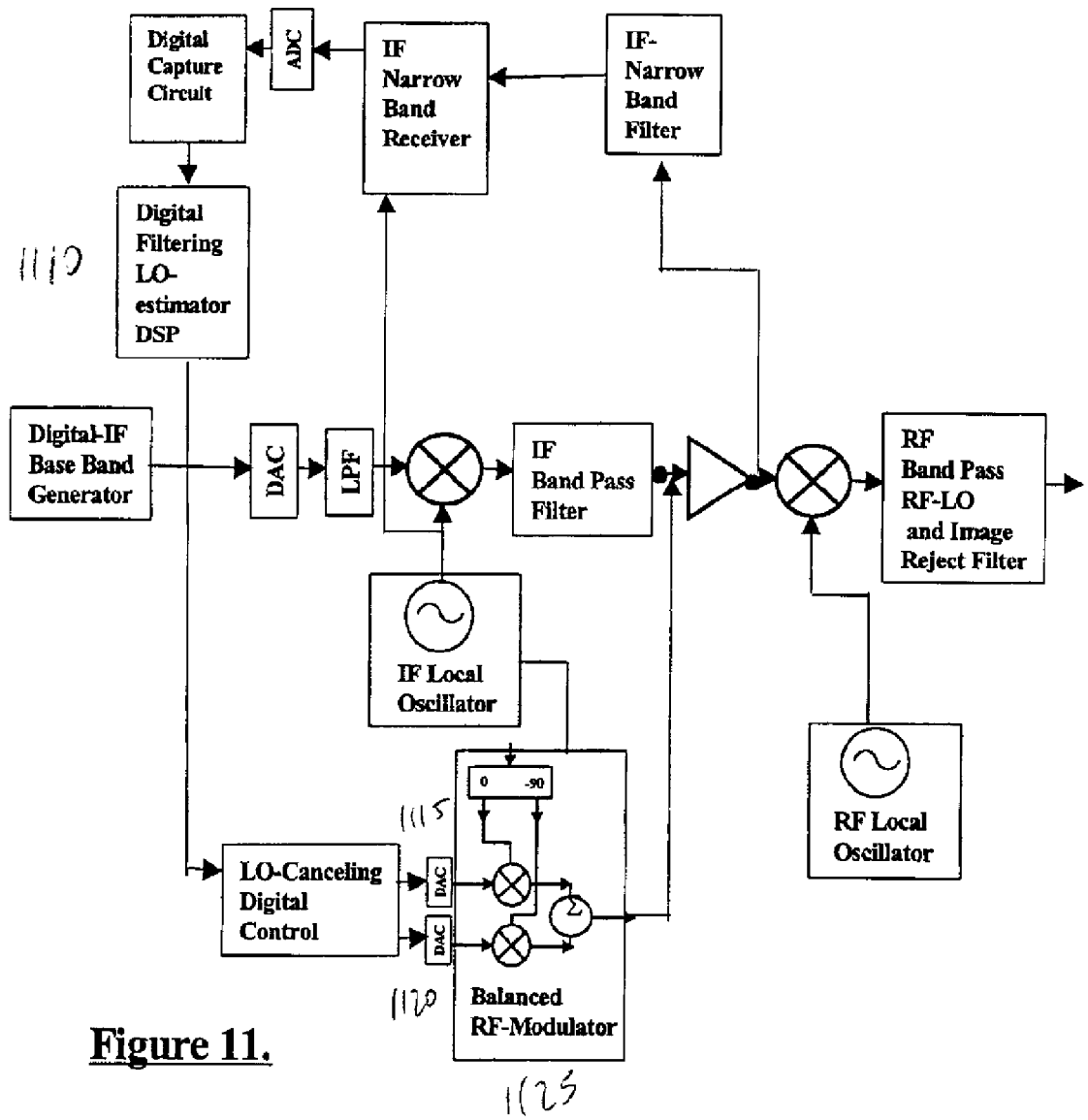
FIG. 11 illustrates IF up-conversion followed by RF up-conversion utilizing active LO-canceling of IF LO leakage to reduce IF-filter selectivity demands.

FIG. 11 illustrates using a narrow-band receiver to measure the LO-leakage. The correction is calculated in a DSP 1110 and supplied to two DACs 1115, 1120 driving a balanced modulator 1125, which injects an anti-phase signal having the same signal strength as the IF-mixer LO-leakage. Since the LO-leakage is a slow varying signal, digital correction adaptation is feasible.

Figure 12:
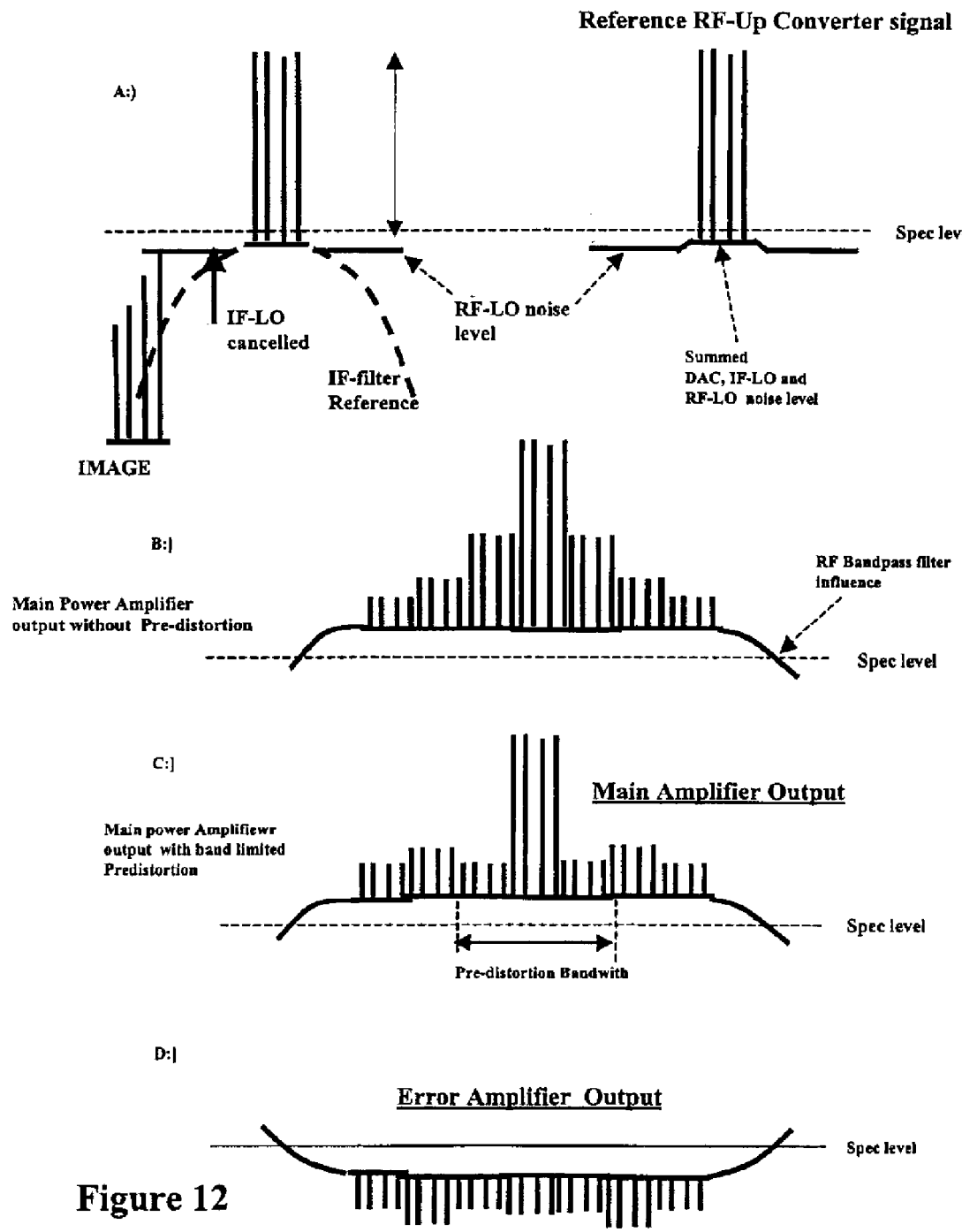
FIG. 12 illustrates spectra of bandwidth-reduced digital predistortion for a main power amplifier in a FF power amplifier having an analog error loop with a bandwidth wider than the digital predistortion bandwidth.

FIG. 12 illustrates the signal performances at different points of the distortion compensation block diagram described in FIG. 4.

FIG. 12A illustrates the reference signal provided by the reference up-converter 403. Within the IF-filter bandwidth, the "flat bottom" average level includes contributions from the available DAC spurious-levels and noise-levels and noise introduced from the IF-local oscillator 424 and RF-oscillator 425. It is assumed that the total reference up-converter 403 is designed so that the IM products do not contribute considerably to the bottom level within the IF-filter bandwidth. The bottom level outside the IF-filter bandwidth (shown as dashed lines) is reduced by filter attenuation. However, the RF-local oscillator 425 wide-band phase noise level propagated through the reference up-converter 403 results in an essentially flat noise level further outside the IF-filter bandwidth. This level is dependent on the reference up-converter 403 design. The reference up-converter 403 may be designed to provide a noise level lower than the noise within the IF-filter bandwidth to improve up-converter performance.

FIG. 12B illustrates the output spectrum of a typical MPA without predistortion. The plurality of signals input to the typical MPA results in IM spectrums of third, fifth, and seventh orders. The signal strengths of the spectrum components normally fall off as the order of IM increases in an active device.

FIG. 12C illustrates the output from the MPA 405 of FIG. 4 when the input signal is predistorted to reduce the signal content corresponding to a bandwidth three times the input signal bandwidth. In this example, the predistortion bandwidth must be three times the input signal bandwidth. A contribution from the predistortion up-converter 404 for the bottom level inside the predistortion bandwidth is also shown. If the requirement on the pre-distorter is to provide suppression of third order IM down to the levels of the fifth and higher IM products, the pre-distorter dynamic range does not need to be as low as the reference up-converter 403, since errors due to higher noise levels are cancelled in the feed forward loop.

FIG. 12D illustrates the resulting error signal after subtraction of the MPA 405 signal sample from the reference up-converter 403 signal at the comparison point 407 in FIG. 4. The signals are time delayed and compensated properly before being generated in the controller 402 to cancel the signal carrier in the error amplifier signal.

The error signal within the analog wide-band error loop cancels the remaining distortion and noise coming from the MPA 405 at coupler 413, to ideally provide an output the same as the reference up-converter 403. The application of FIG. 4 results in a "Plurality Signal Generator."

Figure 13:
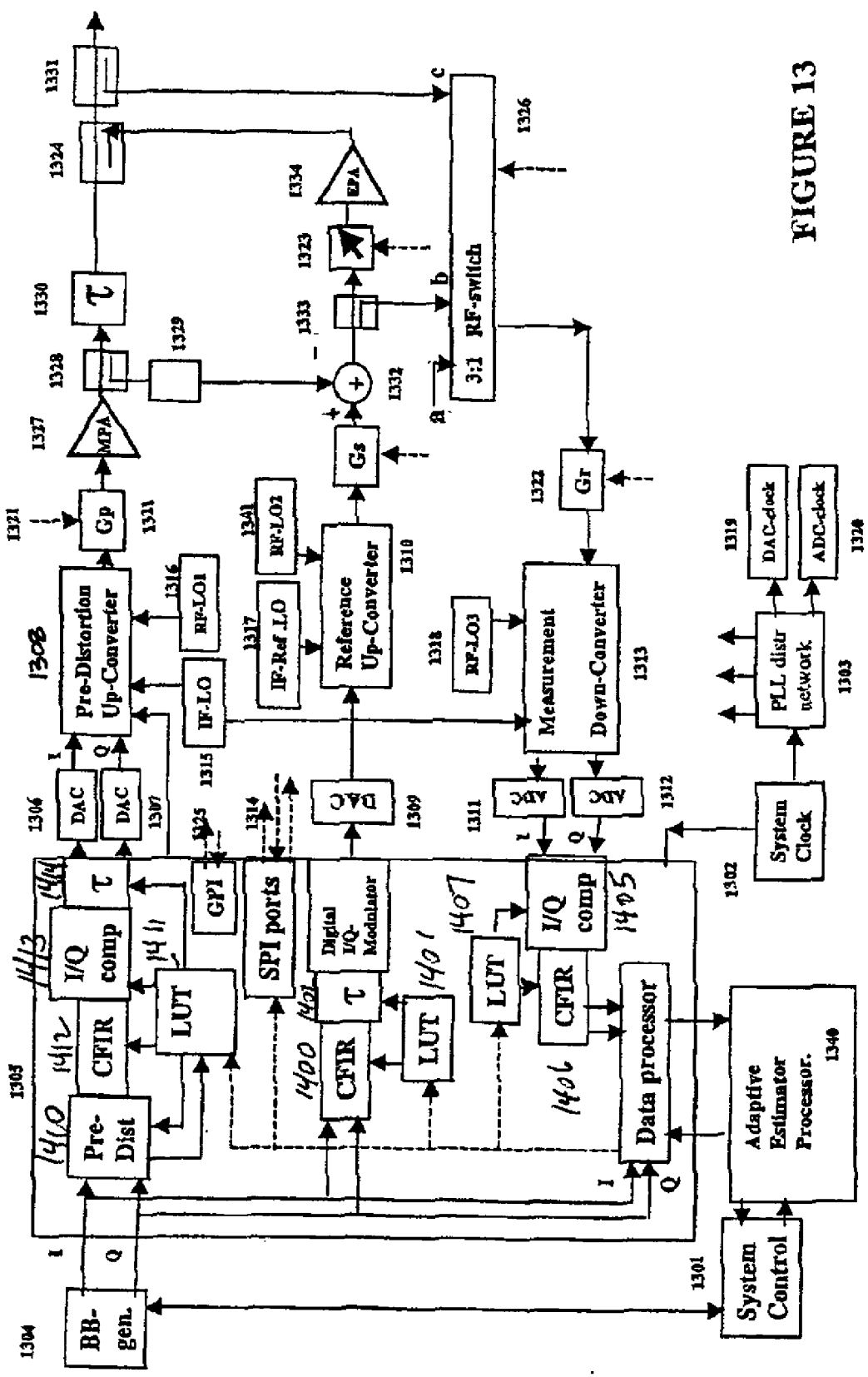
FIG. 13 illustrates a plurality signal generator.

A detailed implementation of the plurality signal generator apparatus according to an embodiment of the invention is illustrated in FIG. 13. The input source is the system controller 1301, which controls signal power levels, timing and data that is sent through the apparatus. A system reference clock 1302, which is a precision oscillator, is used to derive different clocks and PLL-synthesized local oscillators used in the system through the distribution network 1303. The system controller 1301 provides data to the digital baseband generator 1304, which generates the digital I- and Q- data streams of the desired combined signal. The system controller 1301 also interfaces to an adaptive estimator processor (AEP) 1340 for program loading, operation, and error and maintenance handling.

The baseband generator 1304 provides input signals to the real time application specific integrated circuit (ASIC) 1305, which performs the real time signal processing needed. The ASIC 1305 provides corrected signals to two DACs 1306, 1307 driving the predistortion up-converter 1308. The ASIC 1305 also provides a digital input signal to a DAC 1309 that drives the reference up-converter 1310. The ASIC 1305 also receives I and Q digital signals from two ADCs 1311,1312, which convert the measurement down-converter 1313 analog output signals to digital signals. The ASIC 1305 also provides, through the serial programmable interface (SPI) ports 1314, control of the frequency settings of the PLL synthesizer circuits 1315,1316,1317,1318 and the DAC and ADC clock's 1319,1320. The SPI interface 1314 also controls the digitally controlled gain setting blocks 1321,1322 and the digitally controlled gain/phase adjuster 1323 used for optimum adjustment of the analog error canceling at the output coupler 1324. The ASIC 1305 also includes a general purpose digital interface (GPI) 1325, which receives error signals and provides steering of an RF switch 1326.

The RF switch 1326 provides different signals to be measured by the measurement down-converter 1313 via the gain setting block 1322. When connected to point "b" via the RF switch 1326, the receiver measures the cancellation and the result is used to update the predistortion chain. When connected to point "c", the receiver 1313 measures the overall performance of the apparatus and the result is used for optimal setting of the Gain/Phase Adjuster 1323 through the SPI-interface 1314 in the ASIC 1305.

In operation, the output of the reference up-converter 1310 is input to a comparator 1332. A pre-distorted and time equalized amplified signal generated by predistortion circuitry 1308, gain adjuster 1321, and a MPA 1327 is sampled by a sampling device 1328, gain adjusted by the attenuator 1329, and input to the comparator 1332. The error signal, which is the difference between the reference signal and the amplified signal is sampled by the measurement down-converter 1313 for adaptive optimization of predistortion and reference signal canceling. The error signal is also supplied to the gain/phase adjuster 1323, for gain and phase adjustments, and amplified in the EPA 1334. The amplified error signal is combined, in anti-phase to cancel errors, with the output signal received from the MPA 1327 via a time delay unit 1330 in the combiner 1324. The time delay unit 1330 compensates for the delay introduced in the error amplifier chain 1323,1334. A signal sampler 1331 at the output of the apparatus provides a signal sample to the RF-switch 1326 for supervision and adjustment of the FF loop overall performance by the measurement down-converter 1313.

Other implementations of the error loop adjustments may also be used. For example, a "pilot tone" FF loop control adjustment can be used, as in the prior art. In pilot tone FF loop control, a test signal, or pilot signal, is mixed with the input signal via a coupler before the input of the MPA. The level of the pilot signal is adjusted to be equal to the level of the distortion components being generated in the MPA. The pilot signal, which is distorted by the MPA, is detected using a narrow band or a synchronized receiver tuned to the pilot signal. The amplitude of the pilot is detected and forwarded to the DSP and controller to determine the precise gain and phase adjustments necessary to produce the best cancellation of both the pilot and the distortion introduced by the MPA.

In one embodiment, the pilot tone is added to the digital predistortion signal in the ASIC 1305 with additional digital circuitry in the ASIC 1305. The pilot tone is sampled and sent via the data processor in the ASIC 1305 to the AEP 1340. The AEP 1340 also receives a sampled output signal from the coupler 1331 via the RF switch 1326. The AEP 1340 performs a synchronized detection of the pilot signal and uses this information to adjust the error loop for optimum cancellation. The synchronized detection increases the receiving sensitivity, resulting in accurate cancellation settings in the feed forward loop.

The ASIC 1305 provides the control and support needed for the various functions of the apparatus. Each RF chain, the reference up-converter 1310, the measurement down-converter 1313 and the predistortion up-converter 1308 are supported by the ASIC 1305. The reference up-converter 1310 and the measurement down-converter 1313 are linear circuits requiring linear compensation of the frequency complex gain responses.

Error corrections are needed to support the reference up-converter 1310. The incoming I- and Q- signals are acted on by a compensation FIR filter (CFIR) 1400, which compensates for the linear complex gain variation over the frequency range of the IF-Band pass filters in the up-converter circuitry of the reference up-converter. The filter coefficients used are read from a memory device storing a LUT 1401, which receives its memory contents from the AEP 1340 via a data processor interface in the ASIC 1305. A time delay unit is also used to assure that there is a time window present at the comparator 1332 to provide correct signal canceling.

An I/Q- error compensator 1405, similar to FIG. 7B, in the ASIC 1305 supports the measurement down-converter 1313. A CFIR 1406 reads a LUT 1407 and compensates the receiver for essentially flat frequency response over the utilized frequency band.

A predistortion engine 1410 reads an LUT 1411 based on the values of the I/Q-signals to support the predistortion up-converter 1308. The LUT 1411 is updated by the AEP 1340. The predistortion engine 1410 compensates for the nonlinearities that the signal experiences passing through the nonlinear MPA-chain. A linear CFIR 1412 compensates for the complex frequency gain errors emerging from the low-pass and band pass-filters used in the analog parts of the up-converter. An I/Q- error compensator 1413, similar to FIG. 7A, compensates for I/Q-errors. An adjustable time delay unit 1414 provides the necessary time delay to achieve the best signal cancellation at the comparator 1332 such that only the error signals are output from the comparator 1332 to the analog Error Amplifier chain 1333,1323,1334. All the digital function blocks receive operating data from the one or more respective LUTs 1401, 1407,1411, which are updated by the AEP 1340.

The apparatus of FIG. 13 requires a calibration procedure. The initial calibration is preferably performed during manufacturing of the apparatus and stored in a built in EEPROM-memory, which can be accessed during field initialization of the apparatus. Initially, all compensation blocks in the ASIC load data from the respective LUTs to be transparent to input signals. The measurement down-converter's 1313 RF-front-end, the reference up-converter 1310 chain, and the predistortion up-converter 1308 chain initially have essentially flat frequency response, so different complex gain variations emerge from the IF- and Base-band parts. (Although the RF-frequency responses can be measured during manufacturing and be incorporated into the calibrations if needed.)

The measurement down-converter 1313 is preferably calibrated to enhance the accuracy of the system. A single carrier stimuli signal at a fixed RF-frequency used for measurement is provided by the reference chain so the level at the receiver is almost the same as that used for canceling at the comparator 1332. The pre-distorter chain is not involved. The stimuli signal is measured by the measurement down-converter 1313, which is individually tuned by the RF-local oscillator 1318 setting and stepped in equal frequency steps over the intended frequency range. The input signal I/Q-data and the Measured I/Q- data are provided to the AEP 1340, where time equalization and I/Q-correction is performed. DC-offsets are estimated. The processing results in complex data, such as FFTs, present in equidistant frequency steps for the frequency response of the receiver. Subsequent Inverse-FFT techniques or Equalizer-filter signal processing provide data to the CFIR 1406 to thereby correct for the introduced errors in the measurement down-converter 1313.

An absolute calibration of the measured level of the measurement down-converter 1313 is performed by connecting a known power level RF-source to test point A at the switch 1326.

The reference up-converter 1310 is also calibrated. Once the measurement down-converter 1313 performance is known, the reference up-converter 1310 is tuned to the midpoint of the used RF-band by adjusting the RF-LO 1318. The reference up-converter 1310 is also adjusted to the midpoint of the used RF-band. The stimuli signal to the reference up-converter 1310 is a digital frequency-stepped signal, which sweeps the bandwidth of the reference up-converter 1310. In a similar manner as used for the receiver calibration, data, such as FFT-data, is output after signal processing in the AEP 1340. From the derived frequency response for the reference up-converter 1310, the CFIR 1400 can be derived and provided to the LUT 1401 for the reference chain in the ASIC 1305.

The predistortion up-converter 1308 is also calibrated in a similar manner as used for the reference up-converter 1310. A frequency sweep signal is generated digitally and supplied to the predistortion up-converter 1308 at a level abut 30–40 dB below the power level for full utilization. The IM signals from the MPA 1327 are consequently very low and do not disturb the measurement. The reference up-converter 1310 is disabled during this procedure. The resulting signal from the predistortion up-converter 1308 at the comparator 1332 is approximately the same level as is present during error cancellation in normal operation. The EPA 1340 performs similar I/Q-compensation and frequency response resolutions as for the receiver calibrations. To distinguish between the DC-leakage from the measurement down-converter 1313 and the predistorter 1308, the pre-distorter chain can be tuned one frequency step above or below the measurement down-converter 1313, so the DC-leakages do not occur at the same frequency. Normal signal processing filtering and autocorrelation techniques can be used for distinguishing the different DC-leakages. A FFT-data sequence can be estimated and a correction filter synthesized for the predistortion chain CFIR 1412 and loaded into the corresponding LUT 1411.

To perform a coarse adjustment for the EPA 1334 in the feed forward loop, the reduced power MPA 1327 calibration loop signal described above is sampled at the output coupler 1331 and provided to the AEP 1340 via the RF switch 1326. When the reference up-converter 1310 is disabled, the canceling signal to the EPA 1334 will be the sampled MPA 1327 output signal in anti-phase, but at the same level as the expected distortion. The AEP 1340 uses the sampled output signal from the to adjust the EPA 1334 gain and phase so the output signal is maintained at minimum levels.

After calibration, the measurement down-converter 1313 frequency calibration is used as the reference for the system. Any change in the frequency response afterwards will be related to the calibrated measurements done by the measurement down-converter 1313, which has IF-filters that are essentially very flat over the used frequency and therefore will have a low drift in the frequency response.

When the linear filtering corrections for all the chains are applied, a delay value (Tr) is loaded into the reference chain processing block. From the calibrations a fairly good estimate of the delay value for the predistortion chain (Tp) is present. The difference between the two up-converter chains are added to the Tp delay value in order to have the correct delay for canceling at the comparator 1332.

The use of a one step frequency offset in operation between the tuning of the pre-distorter up-conversion 1308 and the measurement down-converter 1313 is preferably used for ease of resolving the DC-components coming from the analog modulators and demodulators in those chains.

The signal levels are slowly raised to full power while the AEP 1340 loads bursts of data from the incoming I/Q-signals and the detected resulting signal after the comparator 1332 through the signal sampler 1333. The AEP 1340 estimates the corrective value of the delay value Tp that provides the best cancellation and loads the value to the time delay unit 1414 in the pre-distorter chain. The AEP 1340 also calculates the non-linear corrections that are stored in the LUT 1411 driving the predistortion block in the ASIC 1305. During this process the gain/phase adjuster 1323 is set to the lowest available gain to prevent over-driving the EPA 1334. The AEP 1340, also during this process, estimates the MPA chain non-linear performance and begins to update the LUT for the predistortion chain.

When proper cancellation of the signals at the comparator is achieved, the RF-switch 1326 is set to measure the output signal from the apparatus. The AEP 1340 also measures the resulting signal levels and adjusts the reference chain and predistortion chain signal levels so the correct output power from the apparatus is present.

The AEP 1340 adjusts the gain/phase adjuster 1323 to minimize the distortion of the output signal. Autocorrelation methods can be used in the algorithms.

It should be noted that the adjustments of the error loop cancellation can also be performed using the "pilot tone procedure" described above.

Since the apparatus has limited useable RF-bandwidth, due to DAC- and ADC- bandwidths, it may be necessary to perform the calibration procedures in different parts of the available RF frequency range. Particularly, when the non-linear performance of the active devices vary with the frequency used, a need arises for storage of different LUTs so the apparatus can use any frequency band within the system bandwidth. Accordingly, the system controller 1301 loads the correct tables into the apparatus on initiation. In operation, the digital adaptation procedures keep the different tables updated as needed.

It will be appreciated that the steps of the methods illustrated above may be readily implemented either by software that is executed by a suitable processor or by hardware, such as an ASIC.

Although described with reference to a communication system, it will be appreciated by those of ordinary skill in the art that this invention can be embodied in other specific forms without departing from its essential character. For example, the invention may be used in any multi-processor system. The embodiments described above should therefore be considered in all respects to be illustrative and not restrictive.

The various aspects of the invention have been described in connection with a number of exemplary embodiments. To facilitate an understanding of the invention, many aspects of the invention were described in terms of sequences of actions that may be performed by elements of a computer system. For example, it will be recognized that in each of the embodiments, the various actions could be performed by specialized circuits (e.g., discrete logic gates interconnected to perform a specialized function), by program instructions being executed by one or more processors, or by a combination of both.

Moreover, the invention can additionally be considered to be embodied entirely within any form of computer readable storage medium having stored therein an appropriate set of computer instructions that would cause a processor to carry out the techniques described herein. Thus, the various aspects of the invention may be embodied in many different forms, and all such forms are contemplated to be within the scope of the invention. For each of the various aspects of the invention, any such form of embodiment may be referred to herein as "logic configured to" perform a described action, or alternatively as "logic that" performs a described action.

It should be emphasized that the terms "comprises" and "comprising", when used in this specification as well as the claims, are taken to specify the presence of stated features, steps or components; but the use of these terms does not preclude the presence or addition of one or more other features, steps, components or groups thereof.

Various embodiments of Applicants' invention have been described, but it will be appreciated by those of ordinary skill in this art that these embodiments are merely illustrative and that many other embodiments are possible. The intended scope of the invention is set forth by the following claims, rather than the preceding description, and all variations that fall within the scope of the claims are intended to be embraced therein.

What is claimed is:

1. An apparatus for plurality signal generation, comprising:
    a digital baseband generator that generates a digital baseband input signal,
    a controller that receives and processes the digital baseband signal to generate at least one time delayed, gain adjusted driving signal;
    a reference RF up-converter that converts a first one of the driving signals to a desired RF reference signal;
    a predistortion RF up-converter that combines a second one of the driving signals with a predistortion signal and converts the combined pre-distorted signal to a RF predistortion signal;
    an amplifier that amplifies the RF predistortion signal;
    a comparator that compares a sample of the RF predistortion signal with the RF reference signal and outputs an error signal corresponding to the comparison;
    a wide-band feed forward loop that amplifies the error signal and combines, in anti-phase, the amplified error signal with the amplified RF predistortion signal to produce an output signal;
    a measurement RF down-converter that samples and measures the error signal to provide a corresponding digital sampled error signal to the controller; and
    an adaptive estimator processor operatively coupled to the controller to estimate the performance of the apparatus by comparing the measured error signal with a delayed copy of the input signal and provide estimate information to the controller to support adaptive updating of the controller.

2. The apparatus of claim 1, further comprising an output sampler that samples the output signal, an error sampler that samples the error signal and a RF-switch that selectively provides each of the sampled output and error signals to the measurement RF converter.

3. The apparatus of claim 1, wherein the predistortion RF up-converter comprises correction circuitry, the correction circuitry including:

respective I and Q digital multipliers that multiply digital I and Q signals representing the second one of the driving signals by respective gain correction factors;

a phase rotator that multiplies the digital I and Q signals by a phase rotation correction vector;

respective I and Q FIR filters that correct frequency response errors in the digital I and Q signals;

respective I and Q summers that adjust a DC offset of the digital I and Q signals;

respective I and Q DACs that convert the digital I and Q signals to respective first and second analog signals;

respective LPFs that filter the first and second orthogonal analog signals; and an analog modulator that combines and modulates the first and second signals to provide an analog predistortion signal.

4. The apparatus of claim 1, wherein the measurement RF down-converter comprises correction circuitry, the correction circuitry including:

an analog demodulator that demodulates the sampled output signal and provides first and second orthogonal analog signals;

respective LPFs that filter the first and second analog signals;

respective I and Q ADCs that convert the first and second analog signals to respective digital I and Q signals;

respective I and Q digital multipliers that multiply digital I and Q signals by respective gain correction factors;

a phase rotator that multiplies the digital I and Q signals by a phase rotation correction vector;

respective I and Q FIR filters that correct frequency response errors in the digital I and Q signals; and respective I and Q summers that adjust a DC offset of the digital I and Q signals.

5. The apparatus of claim 1, wherein the predistortion RF up-converter includes active IF LO-cancellation circuitry.

6. The apparatus of claim 3, wherein the RF-switch includes an external calibration port.

7. The apparatus of claim 1, wherein a pilot tone signal is added to the second driving signal at the controller, the pilot tone signal also being sampled and sent to the adaptive estimator processor by the controller, the adaptive estimator processor receives a sample of the output signal, performs a synchronized detection of the pilot signal, and uses the detected information to adjust the wide-band feed forward loop.

8. The apparatus of claim 5, wherein the predistortion RF up-converter and the measurement RF down-converter include active RF LO-cancellation circuitry.

9. The apparatus of claim 1, wherein the predistortion RF up-converter and the measurement RF down-converter include adjustable attenuators.

10. The apparatus of claim 1, wherein the predistortion RF up-converter and the measurement RF down-converter operate at different RF-frequencies.

11. An apparatus for plurality signal generation, comprising:

a digital baseband generator that generates a digital baseband input signal, a controller that receives and processes the digital baseband signal to generate at least one time delayed, gain adjusted driving signal, said controller including at least one serial programmable interface port that controls frequency settings of PLL synthesizer circuits, DAC and ADC clock's, gain setting blocks and digitally controlled gain/phase adjuster to apply optimum adjustment of analog error canceling in the apparatus;

a reference RF up-converter that converts a first one of the driving signals to a desired RF reference signal;

a predistortion RF up-converter that combines a second one of the driving signals with a predistortion signal and converts the combined pre-distorted signal to a RF predistortion signal;

an amplifier that amplifies the RF predistortion signal;

a comparator that compares a sample of the RF predistortion signal with the RF reference signal and outputs an error signal corresponding to the comparison;

a wide-band feed forward loop that amplifies the error signal and combines, in anti-phase, the amplified error signal with the amplified RF predistortion signal to produce an output signal;

a measurement RF down-converter that samples and measures the error signal to provide a corresponding digital sampled error signal to the controller; and an adaptive estimator processor operatively coupled to the controller to estimate the performance of the apparatus by comparing the measured error signal with a delayed copy of the input signal and provide estimate information to the controller to support adaptive updating of the controller.

12. The apparatus of claim 11, wherein the controller includes a compensation FIR filter that compensates for linear complex gain variation in the reference up-converter, the compensation FIR filter reading filter coefficients from a look up table.

13. The apparatus of claim 11, wherein the controller includes a compensation FIR filter that compensates for flat frequency response in the measurement down-converter, the compensation FIR filter reading filter coefficients from a look up table.

14. The apparatus of claim 12, wherein, for reference up-converter calibration, the reference up-converter is tuned to the midpoint of the used RF-band by adjusting an associated RF local oscillator and generating a digital frequency-stepped stimuli signal through the reference up-converter, which is individually tuned by an RF-local oscillator setting and stepped in equal frequency steps over an intended frequency range, input signal I/Q-data and the measured I/Q-data being provided to the controller where time equalization and I/Q-correction is performed, DC-offsets are estimated, and signal processing is performed to provide data to the compensation FIR to correct for errors introduced in the reference up-converter.

15. The apparatus of claim 13, wherein, for measurement down-converter calibration, the controller generates a single carrier stimuli signal at a fixed RF-frequency through the reference up-converter, the single carrier stimuli signal measured by the measurement down-converter, which is individually tuned by an RF-local oscillator setting and stepped in equal frequency steps over an intended frequency range, input signal I/Q-data and the measured I/Q- data being provided to the controller where time equalization and I/Q-correction is performed, DC-offsets are estimated, and signal processing is performed to provide data to the compensation FIR to correct for errors introduced in the measurement down-converter.

16. The apparatus of claim 11 further comprising an output sampler that samples the output signal, an error sampler that samples the error signal and a RF-switch that selectively provides each of the sampled output and error signals to the measurement RF converter.

17. The apparatus of claim 11, wherein the predistortion RF up-converter comprises correction circuitry, the correction circuitry including:
respective I and Q digital multipliers that multiply digital I and Q signals representing the second one of the driving signals by respective gain correction factors;
a phase rotator that multiplies the digital I and Q signals by a phase rotation correction vector;
respective I and Q FIR filters that correct frequency response errors in the digital I and Q signals;
respective I and Q summers that adjust a DC offset of the digital I and Q signals;
respective I and Q DACs that convert the digital I and Q signals to respective first and second analog signals;
respective LPFs that filter the first and second orthogonal analog signals; and
an analog modulator that combines and modulates the first and second signals to provide an analog predistortion signal.

18. The apparatus of claim 11, wherein the measurement RF down-converter comprises correction circuitry, the correction circuitry including:
an analog demodulator that demodulates the sampled output signal and provides first and second orthogonal analog signals;
respective LPFs that filter the first and second analog signals;
respective I and Q ADCs that convert the first and second analog signals to respective digital I and Q signals;
respective I and Q digital multipliers that multiply digital I and Q signals by respective gain correction factors;
a phase rotator that multiplies the digital I and Q signals by a phase rotation correction vector;
respective I and Q FIR filters that correct frequency response errors in the digital I and Q signals; and
respective I and Q summers that adjust a DC offset of the digital I and Q signals.

19. The apparatus of claim 11, wherein the predistortion RF up-converter includes active IF LO-cancellation circuitry.

20. The apparatus of claim 19, wherein the predistortion RF up-converter and the measurement RF down-converter include active RF LO-cancellation circuitry.

21. The apparatus of claim 11, wherein the predistortion RF up-converter and the measurement RF down-converter include adjustable attenuators.

22. The apparatus of claim 11, wherein the predistortion RF up-converter and the measurement RF down-converter operate at different RF-frequencies.

* * * * *